United States Patent
Shih et al.

(10) Patent No.: US 11,211,142 B2
(45) Date of Patent: *Dec. 28, 2021

(54) MEMORY REPAIR SCHEME

(71) Applicant: Taiwan Semiconductor Manufacturing Company Limited, Hsinchu (TW)

(72) Inventors: Yi-Chun Shih, Taipei (TW); Po-Hao Lee, Hsinchu (TW); Chia-Fu Lee, Hsinchu (TW); Yu-Der Chih, Hsinchu (TW); Yu-Lin Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/829,149

(22) Filed: Mar. 25, 2020

(65) Prior Publication Data

US 2020/0227133 A1    Jul. 16, 2020

Related U.S. Application Data

(63) Continuation of application No. 16/044,621, filed on Jul. 25, 2018, now Pat. No. 10,636,511.

(60) Provisional application No. 62/537,504, filed on Jul. 27, 2017.

(51) Int. Cl.
| | | |
|---|---|---|
| G11C 16/06 | (2006.01) | |
| G11C 29/00 | (2006.01) | |
| G11C 29/44 | (2006.01) | |
| G06F 12/02 | (2006.01) | |

(52) U.S. Cl.
CPC ........ *G11C 29/808* (2013.01); *G06F 12/0292* (2013.01); *G11C 29/44* (2013.01); *G11C 29/765* (2013.01); *G11C 29/787* (2013.01); *G11C 29/846* (2013.01)

(58) Field of Classification Search
CPC ..... G11C 29/808; G11C 29/44; G11C 29/787; G11C 29/846; G11C 29/765; G11C 29/10; G11C 29/18; G11C 2029/1806; G06F 12/0292
USPC .................................................... 365/185.09
See application file for complete search history.

(56) References Cited

U.S. PATENT DOCUMENTS

| | | | | |
|---|---|---|---|---|
| 10,636,511 | B2* | 4/2020 | Shih .................... | G11C 29/765 |
| 2005/0057961 | A1 | 3/2005 | Ahmad | |
| 2007/0165468 | A1* | 7/2007 | Nishihara .............. | G11C 29/44 365/200 |
| 2016/0307647 | A1* | 10/2016 | Morgan ............... | G11C 29/787 |

* cited by examiner

*Primary Examiner* — Tha-O H Bui
(74) *Attorney, Agent, or Firm* — Jones Day

(57) ABSTRACT

Memory devices and methods of repairing a memory are provided. A first array includes normal memory cells, and a second array includes repair memory cells. The repair memory cells are configured to be used in place of the normal memory cells. A look-up table comprises memory bitcells configured to store a set of entries including addresses of defective memory cells of the normal memory cells. A match circuit is configured to evaluate whether an input memory address is stored as a defective address in the memory bitcells. The match circuit is also configured to generate a selection signal for selecting the normal memory cells or the repair memory cells based on the evaluation.

20 Claims, 9 Drawing Sheets

MEMORY REPAIR SCHEME

CROSS-REFERENCE TO RELATED APPLICATIONS

This application is a continuation of U.S. application Ser. No. 16/044,621, filed Jul. 25, 2018, entitled "Memory Repair Scheme," which claims priority to U.S. Provisional Application No. 62/537,504, filed Jul. 27, 2017, entitled "Memory Repair Scheme," both of which are incorporated herein by reference in their entireties.

BACKGROUND

Semiconductor memories are composed of large arrays of individual cells. Each cell stores a 1 or 0 bit of data (e.g., as an electrical high or low voltage state, as an electrical high or low resistance state, as a high or low magnetization state, etc.). Cells are arranged at the crossings of bit-lines and word-lines. A read or write cycle occurs when a word-line, as well as a pair of bit-lines, are activated. The cell accessed at the intersection of the word-line and the bit-lines either receives written data from the bit-lines or delivers written data to the bit-lines. Cells can be accessed directly based on their respective locations in the memory circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B illustrates a whole wordline row-repair scheme, and FIG. 1C illustrates a fine-grained row-repair scheme, in accordance with some embodiments.

DETAILED DESCRIPTION

Figure 1A:
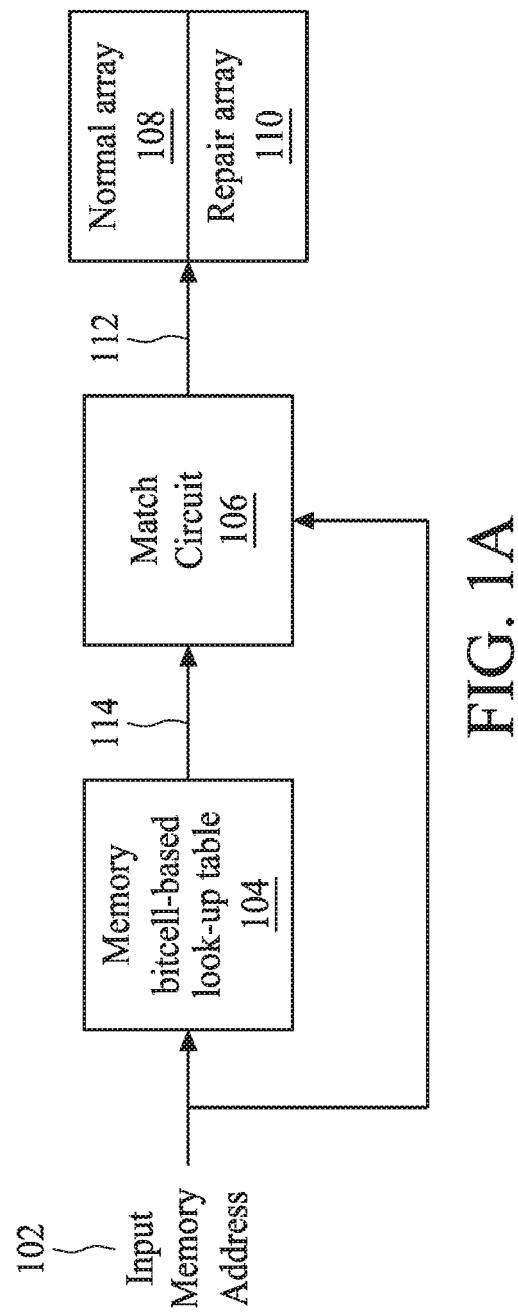
FIG. 1A is a block diagram depicting features of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a block diagram depicting features of a memory device, in accordance with some embodiments. The memory device of FIG. 1A includes a normal array 108 (e.g., a main memory array) having a plurality of normal memory cells arranged in a matrix form. The memory device also includes a repair array 110 (e.g., a redundancy array) having repair memory cells (e.g., redundancy memory cells) arranged in a matrix form.

In embodiments, the repair memory cells of the repair array 110 are configured to be used in place of the normal memory cells. Specifically, a repair memory cell is configured to be used in place of a normal memory cell when the normal memory cell has failed (e.g., has a defect). For instance, in a write operation, if data is to be written to a normal memory cell of the normal array 108 that is determined to be defective, then data is instead written to a repair memory cell of the repair array 110. In this manner, the failed normal memory cell is replaced (e.g., repaired) by the repair memory cell. Likewise, in a read operation, if data is to be read from a normal memory cell of the normal array 108 that is determined to be defective, then data is instead read from a repair memory cell of the repair array 110.

In some embodiments, the normal array 108 comprises memory cells. The memory cells of the normal array 108 comprise dynamic random-access memory (DRAM) cells, static random-access memory (SRAM) cells, Flash memory cells, magnetic random-access memory (MRAM) cells, resistive random-access memory (RRAM) cells, electronic fuse (eFUSE) memory cells, eFlash memory cells, or other types of memory cells, in embodiments. In some embodiments, the repair array 110 comprises DRAM memory cells, SRAM memory cells, Flash memory cells, MRAM memory cells, RRAM memory cells, eFUSE memory cells, eFlash memory cells, or other types of memory cells.

The memory device of FIG. 1A further includes a memory bitcell-based look-up table 104 that is configured to store a set of entries including addresses of defective memory cells of the normal array 108. In embodiments, the memory bitcell-based look-up table 104 is configured to store a variety of other repair information. For instance, in some embodiments, the memory bitcell-based look-up table 104 stores mappings between defective addresses of the normal array 108 and repair addresses of the repair array 110.

The memory bitcell-based look-up table 104 comprises memory bitcells (e.g., memory cells) arranged in an array (e.g., a matrix). A "memory bitcell" is referred to as such because it stores a single bit of data (e.g., a logical "1" or a logical "0"). The memory bitcells of the memory bitcell-based look-up table 104 store the aforementioned addresses of defective memory cells of the normal array 108 and other repair information. In embodiments, the addresses of the defective memory cells of the normal array 108 and the repair information are represented by bits of data stored across multiple memory cells of the memory bitcell-based look-up table 104. For example, an address of a defective memory cell having a size of eight (8) bits is stored across eight (8) memory bitcells of the memory bitcell-based look-up table 104, in some embodiments. Likewise, repair information having a size of eight (8) bits is stored across eight (8) memory bitcells of the memory bitcell-based look-up table 104, in some embodiments. Addresses and repair information having different sizes are within the scope of the disclosure. In some embodiments, the repair information includes a mapping between a defective address of the normal array 108 and a repair address of the repair array 110. In some embodiments, the memory bitcells of the memory bitcell-based look-up table 104 comprise SRAM cells. Such SRAM cells are six-transistor (6T) SRAM cells, seven-transistor (7T) SRAM cells, eight-transistor (8T) SRAM cells, nine-transistor (9T) SRAM cells, ten-transistor (10T) SRAM cells, or another type of SRAM cell, in embodiments. As described in further detail herein, the use of SRAM cells enables a physical size, power consumption, and latency of the memory device to be minimized, among other advantages. In embodiments, the SRAM cells forming the memory bitcell-based look-up table 104 are volatile memory cells, such that the memory bitcell-based look-up table 104 stores addresses of defective memory cells and other repair information in a volatile manner. As explained above, an address of a defective memory cell or repair information are represented by bits of data stored across multiple memory cells of the memory bitcell-based look-up table 104 in embodiments The memory device of FIG. 1A further includes a match circuit 106 (e.g., a controller). When an input memory address 102 for performing a read or write operation is received at the memory device, the input memory address 102 (or a portion thereof) is provided to the match circuit 106. The match circuit 106 evaluates whether the input memory address 102 is stored as a defective address in the memory bitcell-based look-up table 104. Based on the evaluation, the match circuit 106 generates a selection signal 112 for selecting normal memory cells of the normal array 108 or repair memory cells of the repair array 110.

In embodiments, if the match circuit 106 determines that the input memory address 102 is not stored as a defective address in the memory bitcell-based look-up table 104, then the match circuit 106 generates a signal for selecting normal memory cells of the normal array 108. This enables a read or write operation associated with the input memory address 102 to be carried out using the normal memory cells. Conversely, if the match circuit 106 determines that the input memory address 102 is stored as a defective address in the memory bitcell-based look-up table 104, then the match circuit 106 generates a signal for selecting repair memory cells of the repair array 108. This enables the read or write operation to be carried out using the repair memory cells. Examples of the selection signal 112 for selecting the normal memory cells or the repair memory cells are described in further detail below.

In some embodiments, the match circuit 106 evaluates whether the input memory address 102 is stored as a defective address in the memory bitcells of the memory bitcell-based look-up table 104 based on an output 114 from the memory bitcell-based look-up table 104. In these embodiments, the memory bitcell-based look-up table 104 receives the input memory address 102 (or a portion thereof) and uses the input memory address 102 in generating the output 114. Examples of such embodiments are described in further detail below.

As explained above, in embodiments, the memory bitcell-based look-up table 104 comprises memory bitcells (e.g., SRAM memory cells). The use of memory bitcells in the memory bitcell-based look-up table 104 is in contrast to conventional approaches. In conventional approaches, a look-up table for storing repair information is built with registers based on logic gates (e.g., latches, D flip-flops, NAND gates, NOR gates, etc.). A physical size of the look-up table formed of such registers is relatively large, which is undesirable. Further, due to the large size of the conventional register-based look-up table, read and write operations that utilize the look-up table are subject to a high degree of latency. Specifically, because the register-based look-up table is a signal-based circuit, the large size of the table results in an increased amount of time required to perform read and write operations.

By contrast, under the approaches of present disclosure, the memory bitcell-based look-up table 104 is formed of memory bitcells, rather than the registers used in the conventional approaches. As explained above, the memory bitcell-based look-up table 104 comprises memory bitcells (e.g., memory cells) arranged in an array (e.g., a matrix) in some embodiments. Because the sizes of memory bitcells (e.g., SRAM cells) are far smaller than the size of a comparable amount of register-based storage, the physical size of the memory bitcell-based look-up table 104 is smaller than the conventional register-based look-up table. Use of the memory bitcell-based look-up table 104 thus enables an overall size of the memory device to be minimized.

The smaller memory bitcell-based look-up table 104 also results in decreased latency (e.g., faster memory access time) in performing read or write operations, as compared to the conventional approaches. In addition, the power consumption of the memory bitcell-based look-up table 104 is much lower than that of a corresponding register-based look-up table. The memory bitcell-based look-up table 104 thus results in a memory device with a smaller size, decreased latency in performing memory operations, and lower power consumption, as compared to the conventional approaches.

Additionally, in some embodiments, the memory bitcells of the memory bitcell-based look-up table 104 comprise MRAM memory cells, RRAM memory cells, eFUSE memory cells, eFlash memory cells, or another type of memory cell. In these embodiments, the memory bitcell-based look-up table 104 can operate in a two-cell-per-bit mode to further increase speed and read margin. In the two-cell-per-bit mode, two memory cells are used to store one bit of information. The two memory cells store complementary states, and the order of states carries the stored bit. For example, when the first memory cell stores a "1," and the second memory cell stores a "0," the two memory cells are understood to store the value "0." In contrast, when the first memory cell stores a "0," and the second memory cell stores a "1," the two memory cells are understood to store the value "1." Accordingly, for instance, an address of a defective memory cell having a size of eight (8) bits is stored across sixteen (16) memory cells of the memory bitcell-based look-up table 104 in the two-cell-per-bit mode. Likewise, for instance, repair information having a size of eight (8) bits is stored across sixteen (16) memory bitcells of the memory bitcell-based look-up table 104 in the two-cell-per-bit mode.

In the two-cell-per-bit mode, a reference cell is not needed, and read margin is expanded. Specifically, in the two-cell-per-bit mode, sensing is done by accessing the two memory cells that make up a bit at the same time, in embodiments. In some embodiments, the current drawn by each of the memory cells is compared to determine whether the bit is programmed or unprogrammed. In these embodiments, the read margin is the difference between the respective currents of the programmed and unprogrammed states. In some embodiments, this read margin is larger than that of other techniques that do not use the two-cell-per-bit mode. In these other techniques, a memory cell is sensed by comparison to a reference current of a reference cell whose current is midway between the respective currents of the programmed and unprogrammed states, in embodiments. The read margin of these other techniques is the difference between the reference current and the current of the programmed or unprogrammed state, in some embodiments. In some embodiments, this is half the read margin that can be obtained using the two-cell-per-bit mode.

MRAM memory cells, RRAM memory cells, eFUSE memory cells, and eFlash memory cells are non-volatile. Thus, in embodiments that use such memory cells, the memory bitcell-based look-up table 104 stores addresses of defective memory cells and other repair information in a non-volatile manner. In these embodiments, the need to reload repair information into the memory bitcell-based look-up table 104 each time that the memory device wakes up or is restarted is eliminated. This is desirable as it further increases the speed at which memory operations can be performed.

Figures 1B, 1C:
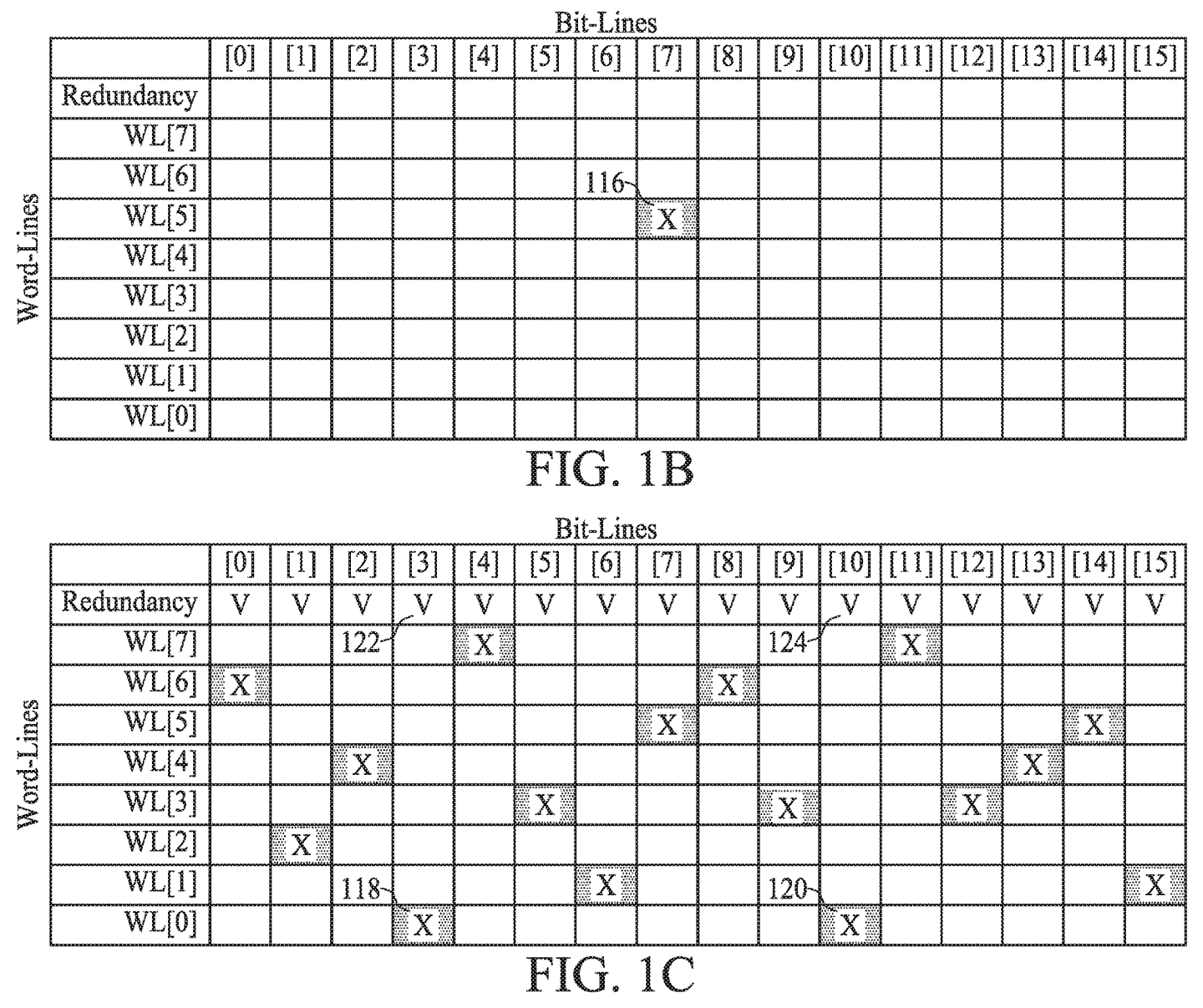

The use of the memory bitcell-based look-up table 104 is advantageous when the normal array 108 comprises MRAM memory cells, RRAM memory cells, eFUSE memory cells, eFlash memory cells, or another similar type of memory cells. These types of memory cells generally exhibit a relatively high defect density. Due to the high defect density, the memory bitcell-based look-up table 104 is required to store a relatively large amount of repair information. A conventional register-based look-up table capable of storing the large amount of repair information has a very large physical size and suffers from the other drawbacks noted above (e.g., latency in performing read and write operations, high power consumption, etc.). Alternatively, to keep the physical size of the conventional register-based look-up table relatively small, the conventional register-based look-up table may be used to store only a limited amount of repair information. The limited amount of repair information may enable only a relatively coarse repair scheme (e.g., for some defective memory cells of the normal array 108, repair information may be unavailable, thus preventing these cells from being repaired). To illustrate the relatively coarse repair scheme, reference is made to FIG. 1B. In this figure, WL[0]-[7] comprise memory cells of a normal array (e.g., normal array 108 of FIG. 1A), and a redundancy word line comprises memory cells of a repair array (e.g., repair array 110). In this example, the WL[5] has a defect 116 at bit-line [7], as shown in the figure. Because the conventional register-based look-up table can only store a limited amount of repair information, the repair information may indicate that the entire WL[5] should be replaced with the redundancy word line, as shown in the figure. This is an example of whole word-line row-repair. In this example, the repair information only enables correction of one defect, due to the limited amount of repair information stored in the conventional register-based look-up table.

By contrast, the memory bitcell-based look-up table 104 can store the repair information in a more compact manner, due to the relatively small sizes of the memory bitcells. This enables the memory bitcell-based look-up table 104 to be relatively small in size and/or to store a large amount of repair information for providing a relatively fine repair scheme. To illustrate the relatively fine repair scheme, reference is made to FIG. 1C. In this figure, WL[0]-[7] comprise memory cells of a normal array (e.g., normal array 108 of FIG. 1A), and a redundancy word line comprises memory cells of a repair array (e.g., repair array 110). In this example, the WL[0] has a defect 118 at bit-line [3] and a defect 120 at bit-line [10], as shown in the figure. Because the memory bitcell-based look-up table 104 can store a large amount of information, the repair information may indicate that the defect 118 can be repaired using repair location 122 of the redundancy word-line, and that the defect 120 can be repaired using repair location 124 of the redundancy word-line. In a similar manner, the memory bitcell-based look-up table 104 has the capacity to store repair information for correcting all of the other defects shown in WL[1]-[7] with repair locations of the redundancy word-line. Thus, rather than enabling the coarse, whole wordline row-repair of FIG. 1B, the memory bitcell-based look-up table 104 enables sixteen (16) times the repair capacity and enables individual memory cells to be repaired. Other values for repair capacity are within the scope of the disclosure. The memory bitcell-based look-up table 104 also provides the other advantages described above (e.g., lower latency, lower power consumption, etc.).

Figure 2:
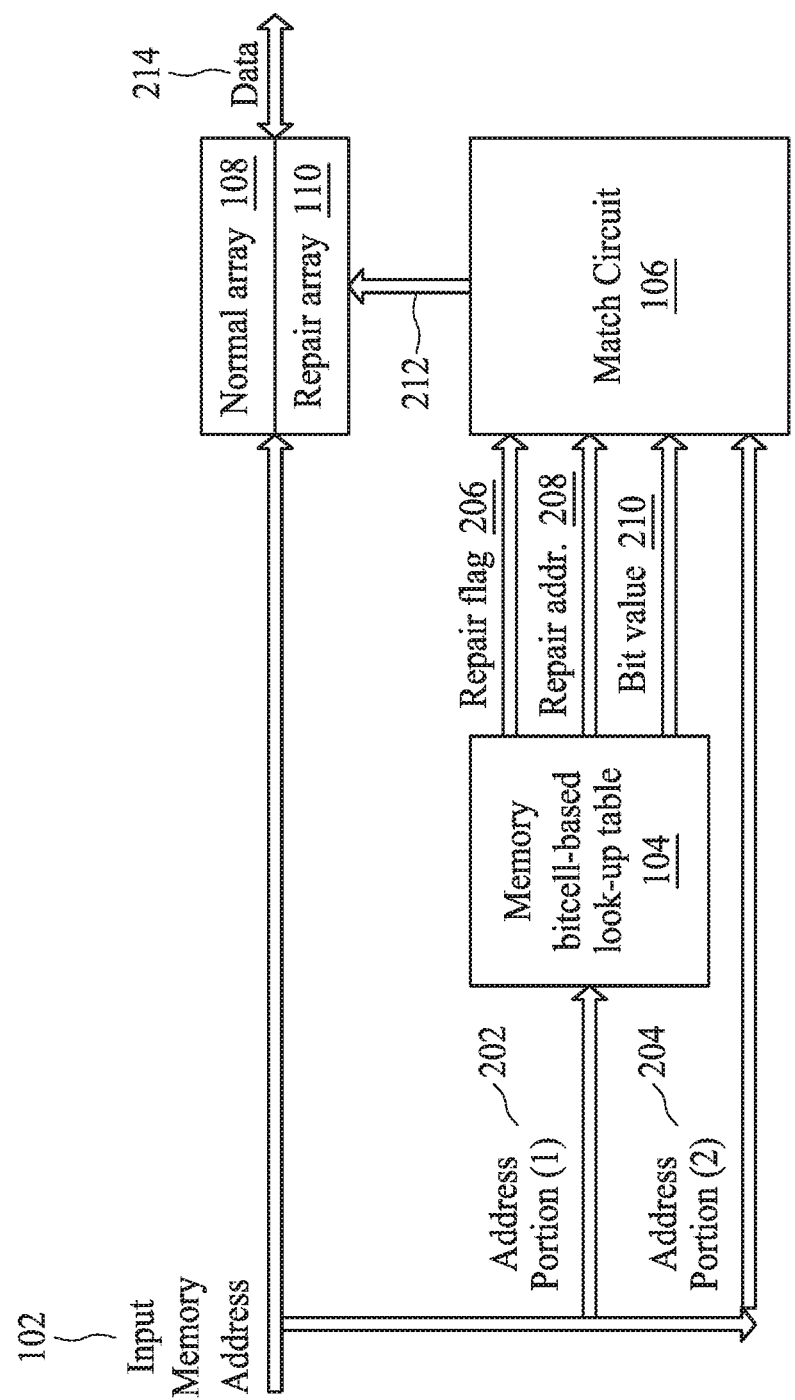
FIG. 2 is a block diagram depicting a memory device including a memory bitcell-based look-up table, in accordance with some embodiments.

FIG. 2 is a block diagram depicting a memory device including a memory bitcell-based look-up table, in accordance with some embodiments. This figure depicts components and features that are the same as or similar to those of FIG. 1A, and like reference numerals are used to designate like parts in these figures. The memory device of FIG. 2 includes the memory bitcell-based look-up table 104, match circuit 106, normal array 108, and repair array 110 of FIG. 1A described above. As illustrated in the figure, the memory device receives the input memory address 102, which specifies a memory address of the normal array 108 for performing a memory access operation (e.g., a read operation, a write operation, etc.). For instance, the input memory address 102 is an address of the normal array 108 from which data is to be read or an address of the normal array 108 to which data is to be written.

In embodiments, the match circuit 106 is configured to evaluate whether the input memory address 102 is stored as a defective address in the memory bitcell-based look-up table 104 based on an output from the memory bitcell-based look-up table 104. To implement this, the memory bitcell-based look-up table 104 is configured to receive a first portion 202 (i.e., labeled "Address Portion (1)" in FIG. 2) of the input memory address 102. In some embodiments, the input memory address 102 is specified using a binary number, and the first portion 202 comprises a most-significant bit or set of most-significant bits of the binary number.

The memory bitcell-based look-up table 104 matches the first portion 202 to the set of entries that it stores to generate an output that is transmitted to the match circuit 106. As explained above, the memory bitcell-based look-up table 104 comprises memory bitcells (e.g., memory cells) arranged in an array (e.g., a matrix), and in some embodiments, an entry of the memory bitcell-based look-up table 104 having a size of eight (8) bits is stored across eight (8) memory bitcells of the array. As described below, in embodiments, the output comprises a portion of a defective memory address stored by the memory bitcell-based look-up table 104. The defective memory address is one having the most-significant bit or set of most-significant bits specified by the first portion 202, and the output comprises the remaining bits of the defective address (i.e., the bits of the defective address other than the most-significant bit or set of most-significant bits). The match circuit 106 receives the output from the memory bitcell-based look-up table 104 and further receives a second portion 204 (i.e., labeled "Address Portion (2)" in FIG. 2) of the input memory address 102. In embodiments where the input memory address 102 is specified as a binary number, the second portion 204 comprises one or more bits of the input memory address 102 that were not provided to the memory bitcell-based look-up table 104. In embodiments, the match circuit 106 compares the output to the second portion 204 to evaluate whether the input memory address 102 is stored as a defective address in the memory bitcell-based look-up table 104.

To illustrate example operations of the memory bitcell-based look-up table 104 and match circuit 106 of FIG. 2, consider an example in which the input memory address 102 is specified using a three-bit binary number "011." In other embodiments, the input memory address 102 is specified using a binary number having a different size (e.g., 2 bits, 4 bits, 8 bits, etc.). A set of addresses specified by three bits are capable of addressing eight (8) (i.e., 2^3) different memory locations. The first portion 202 of the input memory address 102 provided to the memory bitcell-based look-up table 104 is a most-significant bit or set of most-significant bits of the input memory address 102. In this example, assume that the first portion 202 comprises a single most-significant bit of the input memory address 102, which is "0." In another example, the first portion 202 may include the two most significant bits ("01") of the input memory address 102, for instance.

The memory bitcell-based look-up table 104 (i) determines defective addresses of the normal array 108 that have the most-significant bit or set of most-significant bits specified by the first portion 202, and (ii) transmits the remaining bits of the defective addresses to the match circuit 106. In the example where the first portion 202 comprises the single most-significant bit "0" of the input memory address 102, the memory bitcell-based look-up table 104 determines whether the following addresses are defective in the normal array 108: "000," "001," "010," and "011." Each of these addresses has the most-significant bit "0" specified by the first portion 202. If the memory bitcell-based look-up table 104 determines that the address "010" is a defective address in the normal array 108, for instance, then the memory bitcell-based look-up table 104 transmits the least-significant bits "10" to the match circuit 106. In embodiments, the memory-bitcell based look-up table 104 also transmits to the match circuit 106 a repair flag 206 indicating that a defective address having the most-significant bit or set of most-significant bits specified by the first portion 202 has been found.

In addition to receiving the output (i.e., the least-significant bits "10") from the memory bitcell-based look-up table 104, the match circuit 106 further receives the second portion 204 of the input memory address 102. In embodiments, the second portion 204 comprises the remaining, least-significant bits of the input memory address 102 that were not provided to the memory bitcell-based look-up table 104. In the example where the first portion 202 comprises the single most-significant bit of the "011" input memory address 102 (i.e., "0"), the second portion 204 comprises the remaining least-significant bits of the input memory address 102, which are "11." The match circuit 106 compares the output from the memory bitcell-based look-up table 104 (i.e., the bits "10") to the second portion 204 (i.e., the bits "11") to evaluate whether the input memory address 102 is stored as a defective address in the memory bitcell-based look-up table 104.

In the example described above, because the output from the memory bitcell-based look-up table 104 (i.e., "10") does not match the second portion 204 (i.e., "11"), the match circuit 106 determines that the input memory address 102 is not stored as a defective address in the memory bitcell-based look-up table 104. Accordingly, the match circuit 106 generates an output 212 that selects the normal array 108 for performing the memory access operation associated with the input memory address 102. In embodiments, the output 212 includes the input memory address 102, which specifies a memory cell of the normal array 108. The output 212 further includes a signal for enabling the normal array 108, in embodiments. Based on the output 212, data 214 is read from the normal array 108 or written to the normal array 108, depending on the requested memory access operation.

Conversely, if the output from the memory bitcell-based look-up table 104 is determined to match the second portion 204, then the match circuit 106 determines that the input memory address 102 is stored as a defective address in the memory bitcell-based look-up table 104. Accordingly, the match circuit 106 generates the output 212 that selects the repair array 110 for performing the requested memory access operation. In embodiments, the output 212 includes a signal for enabling the repair array 110 and a repair address 208 (i.e., a redundancy address) in the repair array 110 for the input memory address 102. Based on the output 212, data 214 is read from the repair array 110 or written to the repair array 110, depending on the requested memory access operation.

The match circuit 106 receives the repair address 208 from the memory bitcell-based look-up table 104, in embodiments. As explained above, the memory bitcell-based look-up table 104 stores mappings between defective addresses of the normal array 108 and repair addresses of the repair array 110. Accordingly, when the memory bitcell-based look-up table 104 locates a defective address having the most-significant bit or set of most-significant bits specified by the first portion 202, the memory bitcell-based look-up table 104 transmits the repair address 208 to the match circuit 106, in embodiments. This enables the match circuit 106 to provide the repair address 208 to the repair array 110 as part of the output 212. Further, in embodiments, the match circuit 106 receives a bit value 210 from the memory bitcell-based look-up table 104. The bit value 210 provides the information of the defective address that needs to be replaced by information from the repair address 208 in the repair array 110.

Figure 3:
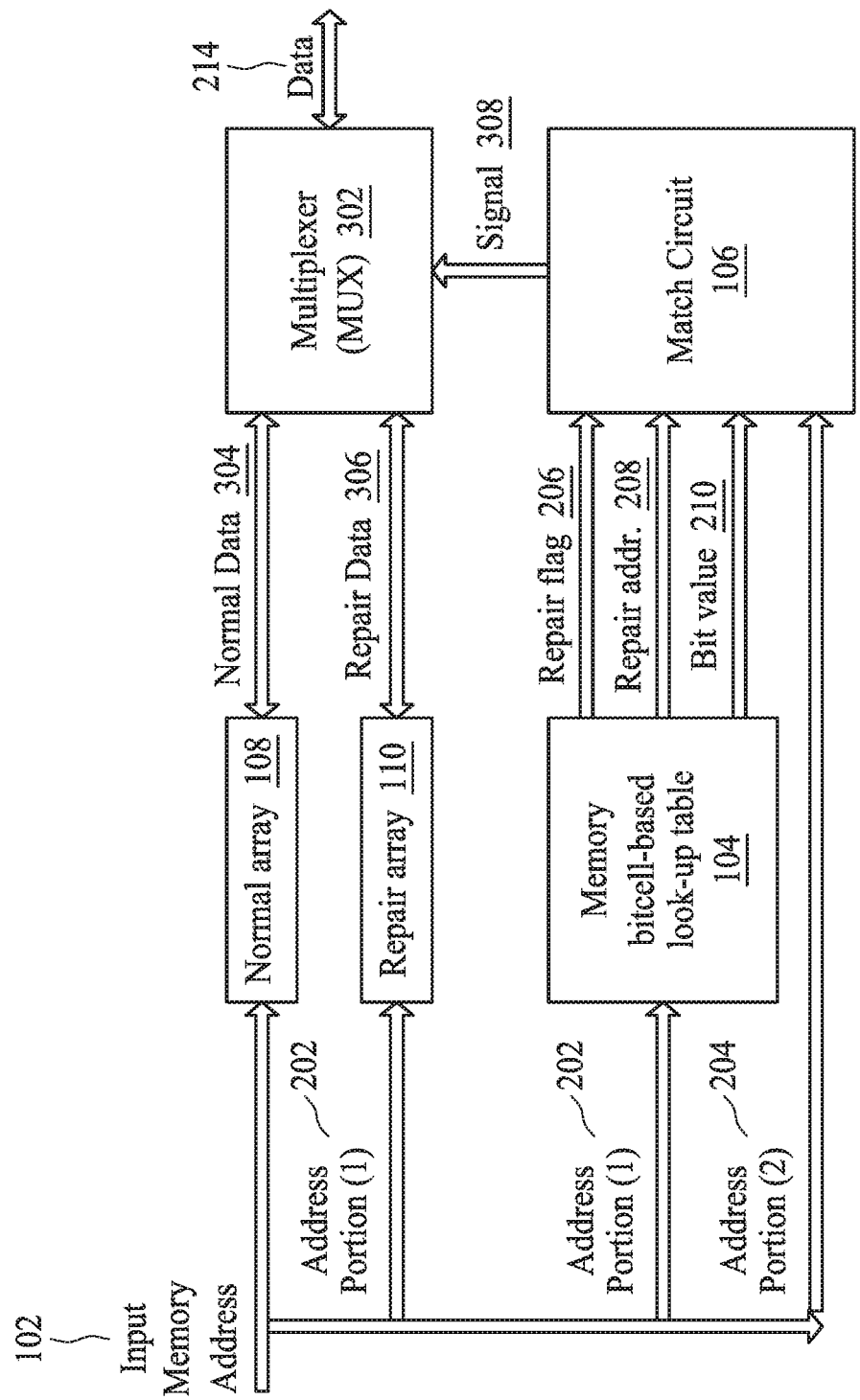
FIG. 3 is a block diagram depicting a memory device including a multiplexer, in accordance with some embodiments.

FIG. 3 is a block diagram depicting a memory device including a multiplexer (MUX), in accordance with some embodiments. This figure depicts components and features that are the same as or similar to those of FIGS. 1A and 2, and like reference numerals are used to designate like parts in these figures. The memory device of FIG. 3 includes the memory bitcell-based look-up table 104, match circuit 106, normal array 108, and repair array 110 of FIGS. 1A and 2 described above. As illustrated in the figure, the memory device further comprises a MUX 302. When a read operation is performed using the memory device, the MUX 302 reads data from either the normal array 108 or the repair array 110. Likewise, when a write operation is performed, the MUX 302 determines whether to write data to the normal array 108 or the repair array 110.

To implement a read operation utilizing the MUX 302, the normal array 108 receives the input memory address 102, and the repair array 110 receives the first portion 202 of the input memory address 102. The first portion 202 comprises the most-significant bit or set of most-significant bits of the input memory address 202, as described above. Based on the received input memory address 102, the normal array 108 transmits normal data 304 stored at the input memory address 102 to the MUX 302. Based on the received first portion 202, the repair array 110 transmits repair data 306 to the MUX 302.

In embodiments, the repair array 110 stores repair data 306 for all possible values of the first portion 202. In the example described above with reference to FIG. 2, the first portion 202 comprises the single most-significant bit of the input memory address 102. In this example, the first portion 202 may be either "0" or a "1," and thus, the repair array 110 stores (i) repair data 306 for the first portion 202 "0," and (ii) repair data 306 for the first portion 202 "1." Likewise, in embodiments where the first portion 202 comprises the two most-significant bits of the input memory address 102, the repair array 110 stores four pieces of repair data 306 for all possible values of the first portion 202 (i.e., "00," "01," "10," and "11").

For the read operation, the MUX 302 receives the normal data 304 and the repair data 306 and selects one of them to be read out (e.g., to a user or other component requesting data). Specifically, the MUX 302 selects one of the normal data 304 and the repair data 306 based on a signal 308 (e.g., a selection signal, a data select signal, etc.) received from the match circuit 106. In generating the signal 308, the match circuit 106 operates in a same or similar manner to that described above with reference to FIG. 2.

Specifically, the match circuit 106 receives the second portion 204 of the input memory address 102, as described above. The match circuit 106 (i) compares the second portion 204 to the output generated by the memory bitcell-based look-up table 104, and (ii) generates the signal 308 based on the comparison. If the second portion 204 does not match the output from the memory bitcell-based look-up table 104, this indicates that the input memory address 102 is not stored as a defective address in the memory bitcell-based look-up table 104. In these instances, the match circuit 106 generates the signal 308 indicating that the normal data 304 should be selected for performing the read operation.

Conversely, if the second portion 204 matches the output from the memory bitcell-based look-up table 104, this indicates that the input memory address 102 is stored as a defective address in the memory bitcell-based look-up table 104. In these instances, the match circuit 106 generates the signal 308 indicating that the repair data 306 should be selected for performing the read operation. The MUX 302 selects one of the normal data 304 and the repair data 306 based on the signal 308, and the selected data is the data returned for the read operation.

For a write operation, the MUX 302 receives the data 214 to be written and writes this data to either the normal array 108 or the repair array 110. Specifically, the MUX 302 selects one of the normal array 108 and the repair array 110 for writing the data 214 based on the signal 308 received from the match circuit 106. In generating the signal 308, the match circuit 106 operates in a same or similar manner to that described above with reference to FIG. 2. As described above, the match circuit 106 receives the second portion 204 and the output of the memory bitcell-based look-up table 104. The match circuit 106 uses this information to determine if the input memory address 102 is stored as a defective address in the memory bitcell-based look-up table 104.

If the match circuit 106 determines that the input memory address 102 is not stored as a defective address in the memory bitcell-based look-up table 104, then the match circuit 106 generates the signal 308 indicating that the data 214 should be written to the input memory address 102 in the normal array 108. Conversely, if the match circuit 106 determines that the input memory address 102 is stored as a defective address in the memory bitcell-based look-up table 104, then the match circuit 106 generates the signal 308 indicating that the data 214 should be written to the repair address 208 in the repair array 110.

Figure 4:
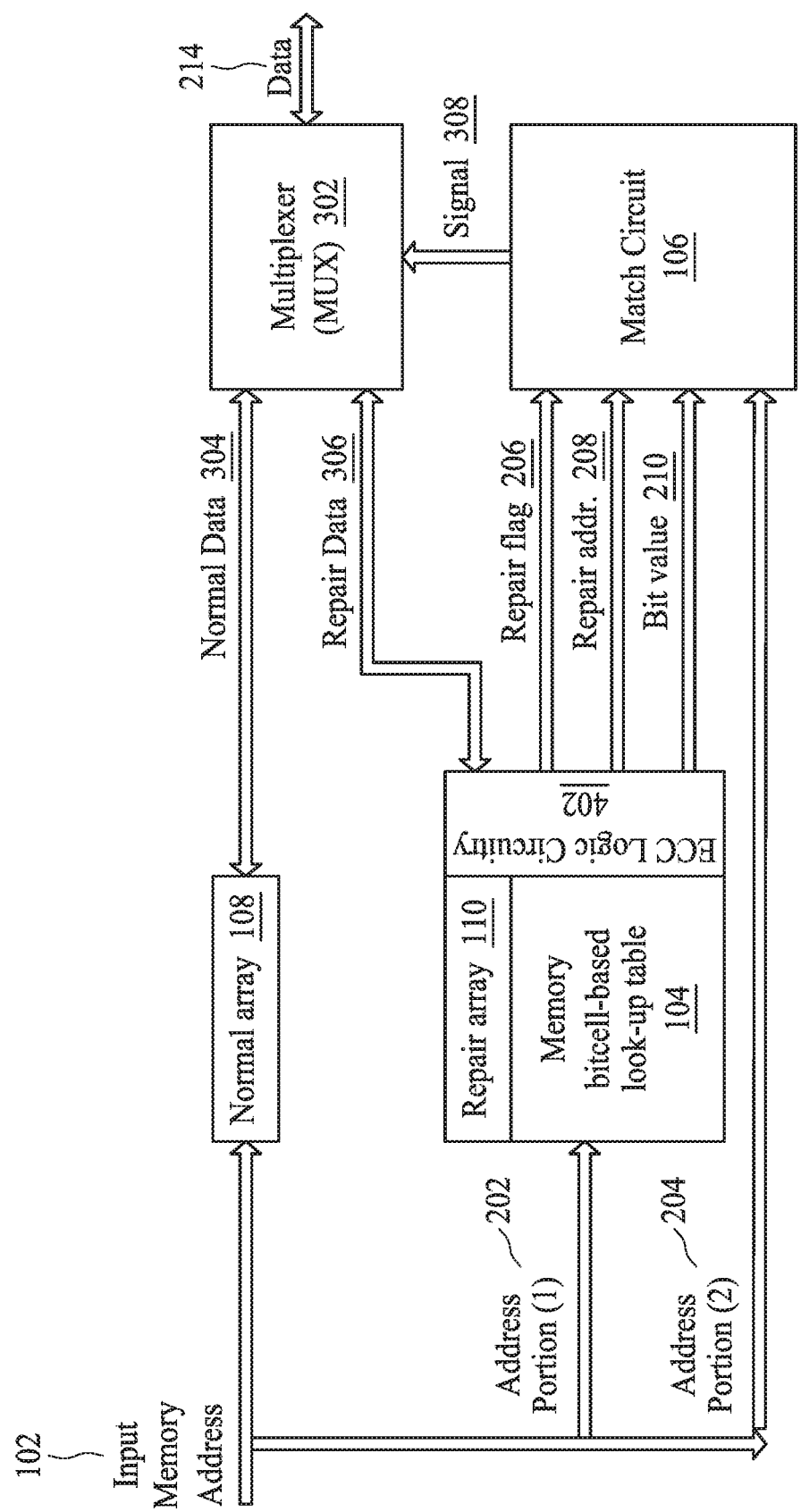
FIG. 4 is a block diagram depicting a memory device having a repair array and a look-up table array combined into a single array, in accordance with some embodiments.

FIG. 4 is a block diagram depicting a memory device having a repair array and a look-up table array combined into a single array, in accordance with some embodiments. This figure depicts components and features that are the same as or similar to those of FIGS. 1A, 2, and 3, and like reference numerals are used to designate like parts in these figures. In the memory device of FIG. 4, the memory bitcell-based look-up table 104 and repair array 110 are combined into a single array. The single array is protected by error-correcting code (ECC) logic circuitry 402. In some embodiments, the ECC logic circuitry 402 comprises an error-correcting code (ECC) encoder, ECC decoder, parity memory, and correction block. The memory bitcell-based look-up table 104 and repair array 110 store data bits, and the ECC logic circuitry 402 uses parity bits stored in the parity memory to correct defective bits of the memory bitcell-based look-up table 104 and repair array 110, in some embodiments. Specifically, in some embodiments, the ECC encoder of the ECC logic circuitry 402 generates n parity bits from m data bits of the memory bitcell-based look-up table 104 or repair array 110, where n and m are non-zero integer values. These parity bits are stored in the parity memory of the ECC logic circuitry 402 in some embodiments. Subsequently, in some embodiments, when reading from the memory bitcell-based look-up table 104 or repair array 110, m bits from the memory bitcell-based look-up table 104 or repair array 110 are input to the ECC decoder of the ECC logic circuitry 402. The ECC decoder regenerates the n parity bits based on the received m bits, and n parity bits from the parity memory are compared to the regenerated n parity bits to determine if the data is correct and which bit or bits are in error and need correction, in some embodiments. The correction block of the ECC logic circuitry 402 corrects the data if necessary, and the corrected data is output from the correction block. Generally, a number of errors that can be corrected increases with the number of parity bits used.

In the memory device of FIG. 4, the single array comprising the memory bitcell-based look-up table 104 and repair array 110 receives the first portion 202 of the input memory address 102. This is similar to the embodiment of FIG. 3, where the memory bitcell-based look-up table 104 and the repair array 110 both receive the same first portion 202 of the input memory address 102. The memory bitcell-based look-up table 104 and the repair array 110 of FIG. 4 operate in the manner described above with reference to FIG. 3. Accordingly, read and write operations to the memory device of FIG. 4 are performed in a manner similar to that described above for FIG. 3.

Figure 5:
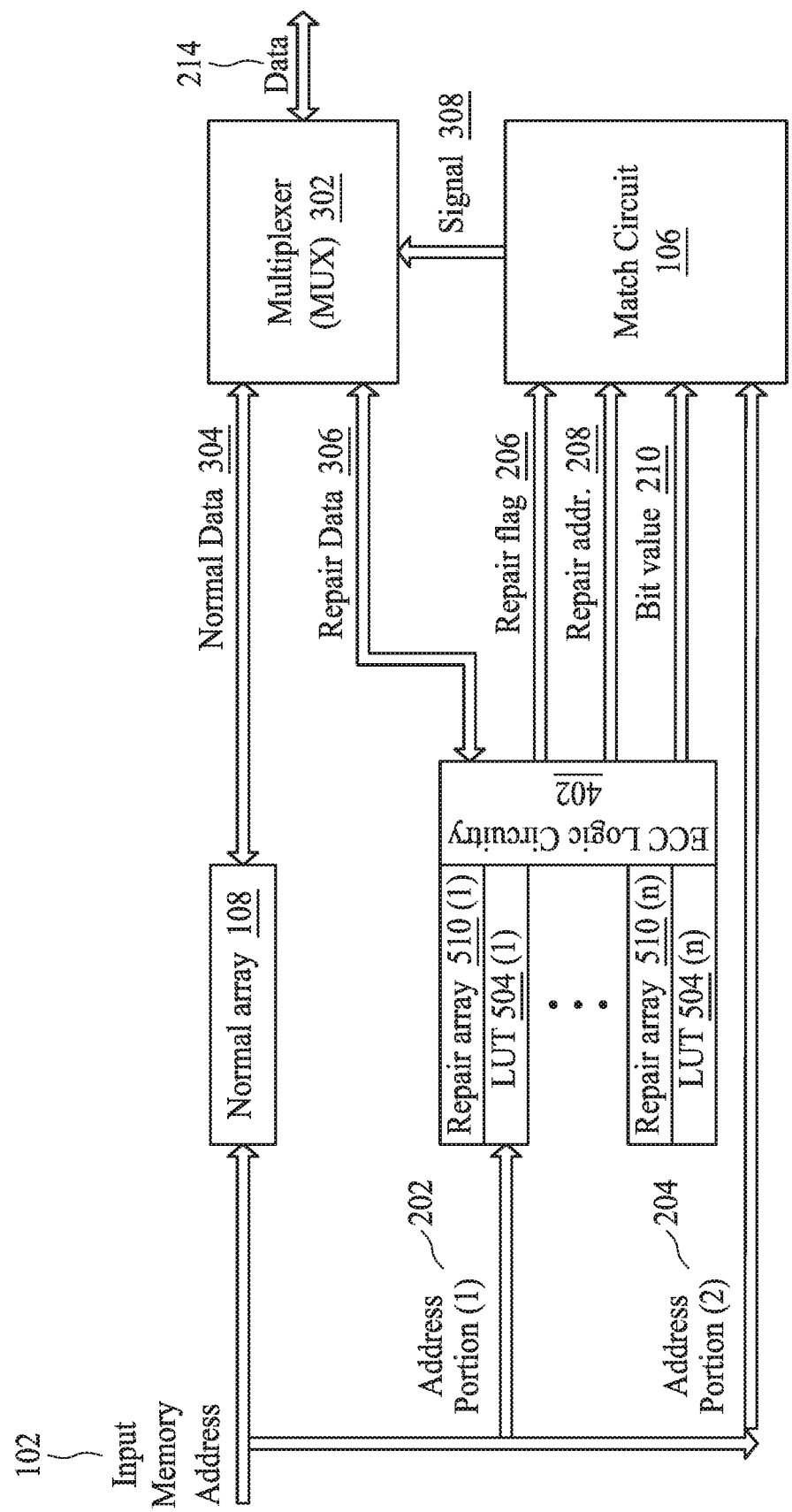
FIG. 5 is a block diagram depicting a memory device including a multi-level repair system, in accordance with some embodiments.

FIG. 5 is a block diagram depicting a memory device including a multi-level repair system, in accordance with some embodiments. This figure depicts components and features that are the same as or similar to those of FIGS. 1A and 2-4, and like reference numerals are used to designate like parts in these figures. In the memory device of FIG. 5, multiple pairs of memory bitcell-based look-up tables 504 and repair arrays 510 are utilized. Specifically, in the example of FIG. 5, n pairs are formed. A first pair comprises a memory bitcell-based look-up table 504 (1) and a repair array 510 (1). Likewise, an n-th pair comprises a memory bitcell-based look-up table 504 (*n*) and a repair array 510 (*n*).

In some embodiments, the pairs of memory bitcell-based look-up tables 504 and repair arrays 510 form a multi-level repair system. For instance, some pairs cover smaller repair units, and other pairs cover larger repair units. For example, in an embodiment, repair array 510 (1) and LUT 504 (1) can repair one defected bit for every 16 continuous addresses, such that the size of its repair unit is 16 addresses. Further, in embodiments, repair array 510 (2) and LUT 504 (2) can repair one defected bit for every 64 continuous addresses, such that the size of its repair unit is 64 addresses. Similarly, the pair 510 (3) and 504 (3) can repair one defected bit for every 512 continuous addresses, in embodiments, such that the size of its repair unit is 512 addresses. Accordingly, some pairs of memory bitcell-based look-up tables 504 and repair arrays 510 cover smaller repair units (e.g., 16 addresses), while other pairs cover larger repair units (e.g., 64 or 512 addresses). In other embodiments, the pairs of memory bitcell-based look-up tables 504 and repair arrays 510 cover different-sized repair units (e.g., 8 addresses, 32 addresses, 128 addresses, etc.).

In embodiments, when multiple defected bits occur in 16 continuous addresses, multiple pairs of repair array 510 and LUT 504 can be used to repair those defect bits. For instance, consider an embodiment where repair array 510 (1) and LUT 504 (1) can repair one defected bit for every 16 continuous addresses, repair array 510 (2) and LUT (2) can repair one defected bit for every 32 continuous addresses, and repair array 510 (3) and LUT (3) can repair one defected bit for every 64 continuous addresses. In this embodiment, when there are two defects in the first 16 addresses, repair array 510 (1) and LUT 504 (1) can be used to repair one of the defected addresses, and repair array 510 (2) and LUT 504 (2) can be used to repair the other defected address. If there is a third defect in the first 16 addresses, repair array 510 (3) and LUT 504 (3) can be used to repair the third defect. In this manner, the rare chance of having multiple defected bits in a small unit can still be covered without significantly increasing the area of repair arrays. Specifically, in this example, repair array 510 (2) and LUT 504 (2) requires less redundancy bitcells than repair array 510 (1) and LUT 504 (1) since it only needs to repair one defected bit for every 32 continuous addresses. Likewise, repair array 510 (3) and LUT 504 (3) requires less redundancy bitcells because it only needs to repair one defected bit for every 64 continuous addresses. By contrast, consider an embodiment with a fixed repair unit size, where repair array 510 (1) and LUT 504 (1), repair array 510 (2) and LUT 504 (2), and repair array 510 (3) and LUT 504 (3) can each repair one defected bit for every 16 continuous addresses. This embodiment has a larger area for repair array 510 (2) and LUT 504 (2) and repair array 510 (3) and LUT 504 (3) compared to the previous example because they are both configured to repair more defected bits.

Figure 6:
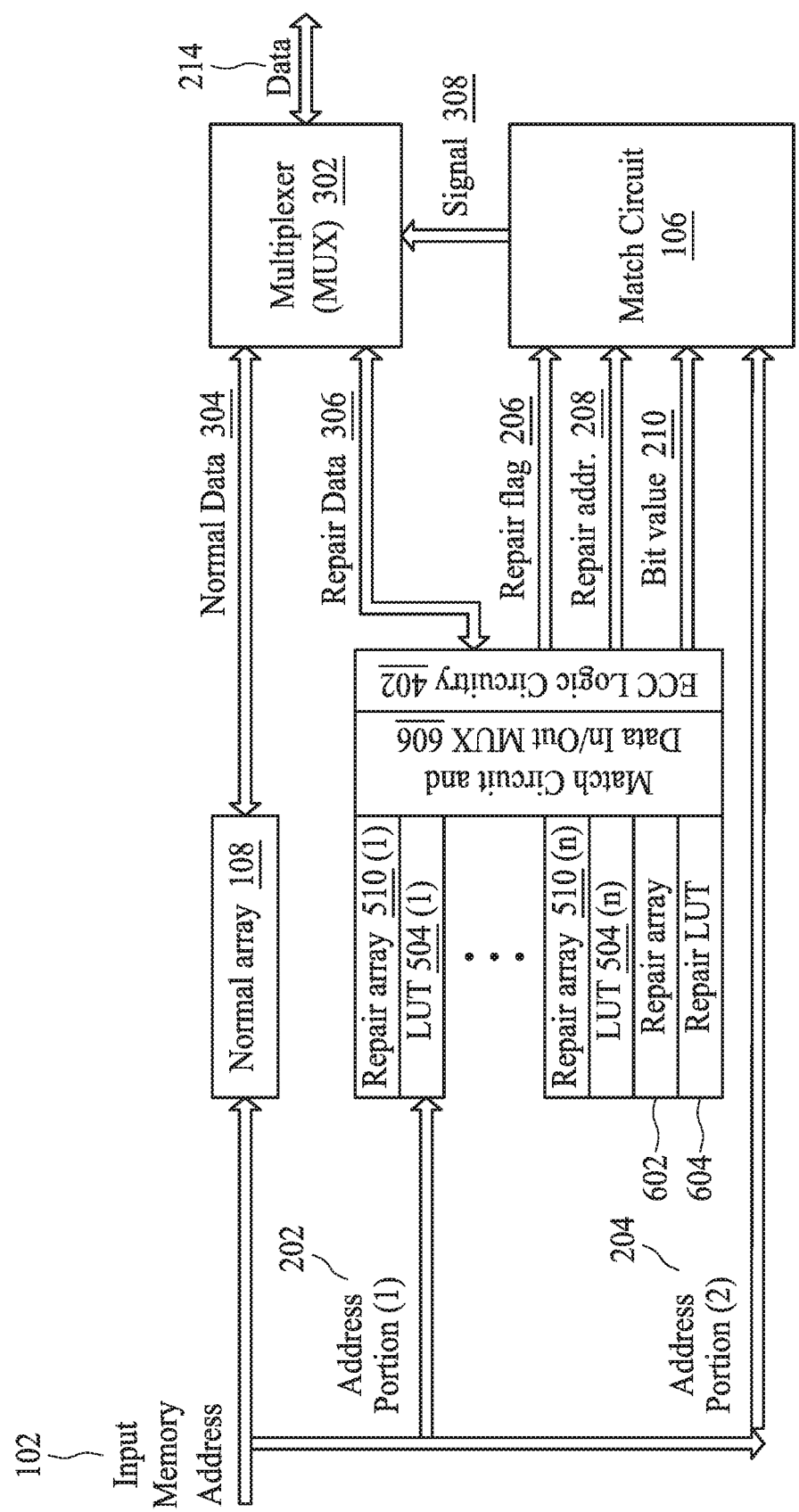
FIG. 6 is a block diagram depicting a memory device including a two-level repair array and look-up table array, in accordance with some embodiments.

FIG. 6 is a block diagram depicting a memory device including a two-level repair array and look-up table array, in accordance with some embodiments. This figure depicts components and features that are the same as or similar to those of FIGS. 1A and 2-5, and like reference numerals are used to designate like parts in these figures. In the memory device of FIG. 6, multiple pairs of memory bitcell-based look-up tables 504 and repair arrays 510 form a multi-level repair system, as described above with reference to FIG. 5. Because defects can exist in the memory bitcell-based look-up tables 504 and repair arrays 510, another level of repair is added in the embodiment of FIG. 6. Specifically, a repair array 602 and a repair look-up table 604 are added in the embodiment of FIG. 6 to protect the memory bitcell-based look-up tables 504 and repair arrays 510.

The repair array 602 and repair look-up table 604 protect the memory bitcell-based look-up tables 504 and repair arrays 510 in a manner that is similar to how the normal array 108 is protected by the memory bitcell-based look-up tables 504 and repair arrays 510. To enable this protection, the memory device of FIG. 6 includes a combined match circuit and data in/out MUX 606. The combined match circuit and data in/out MUX 606 operates in a manner that is similar to that of the match circuit 106 and MUX 302. Specifically, to read from the memory bitcell-based look-up tables 504 or repair arrays 510, the memory bitcell-based look-up tables 504 or repair arrays 510 receives an input memory address, and the repair array 602 receives a first portion of the input memory address. The first portion comprises the most-significant bit or set of most-significant bits of the input memory address, as described above. Based on the received input memory address, the memory bitcell-based look-up tables 504 or repair arrays 510 transmits normal data stored at the input memory address to the combined match circuit and data in/out MUX 606. Based on the received first portion, the repair array 602 transmits repair data to the combined match circuit and data in/out MUX 606. The MUX of the combined match circuit and data in/out MUX 606 receives the normal data and the repair data and selects one of them to be read out. Specifically, the MUX selects one of the normal data and the repair data based on a signal received from the match circuit of the combined match circuit and data in/out MUX 606. In generating the signal, the match circuit of the combined match circuit and data in/out MUX 606 operates in a same or similar manner to the match circuit 106 described above with reference to FIG. 2. If the match circuit of the combined match circuit and data in/out MUX 606 determines that the input memory address is not stored as a defective address in the repair look-up table 604, then the match circuit generates the signal indicating that the data should be read from the input memory address in the memory bitcell-based look-up tables 504 or repair arrays 510. Conversely, if the match circuit of the combined match circuit and data in/out MUX 606 determines that the input memory address is stored as a defective address in the repair look-up table 604, then the match circuit generates the signal indicating that the data should be read from the repair array 602.

To write to the memory bitcell-based look-up tables 504 or repair arrays 510, the MUX of the combined match circuit and data in/out MUX 606 receives the data to be written and writes this data to either (i) the memory bitcell-based look-up tables 504 or repair arrays 510, or (ii) the repair array 602. Specifically, the MUX of the combined match circuit and data in/out MUX 606 selects one of the (i) the memory bitcell-based look-up tables 504 or repair arrays 510, or (ii) the repair array 602 for writing the data based on a signal received from the match circuit of the combined match circuit and data in/out MUX 606. In generating the signal, the match circuit of the combined match circuit and data in/out MUX 606 operates in a same or similar manner to the match circuit 106 described above with reference to FIG. 2. If the match circuit of the combined match circuit and data in/out MUX 606 determines that the input memory address is not stored as a defective address in the repair look-up table 604, then the match circuit generates the signal indicating that the data should be written to the input memory address in the memory bitcell-based look-up tables 504 or repair arrays 510. Conversely, if the match circuit of the combined match circuit and data in/out MUX 606 determines that the input memory address is stored as a defective address in the repair look-up table 604, then the match circuit generates the signal indicating that the data should be written to the repair array 602.

Figure 7:
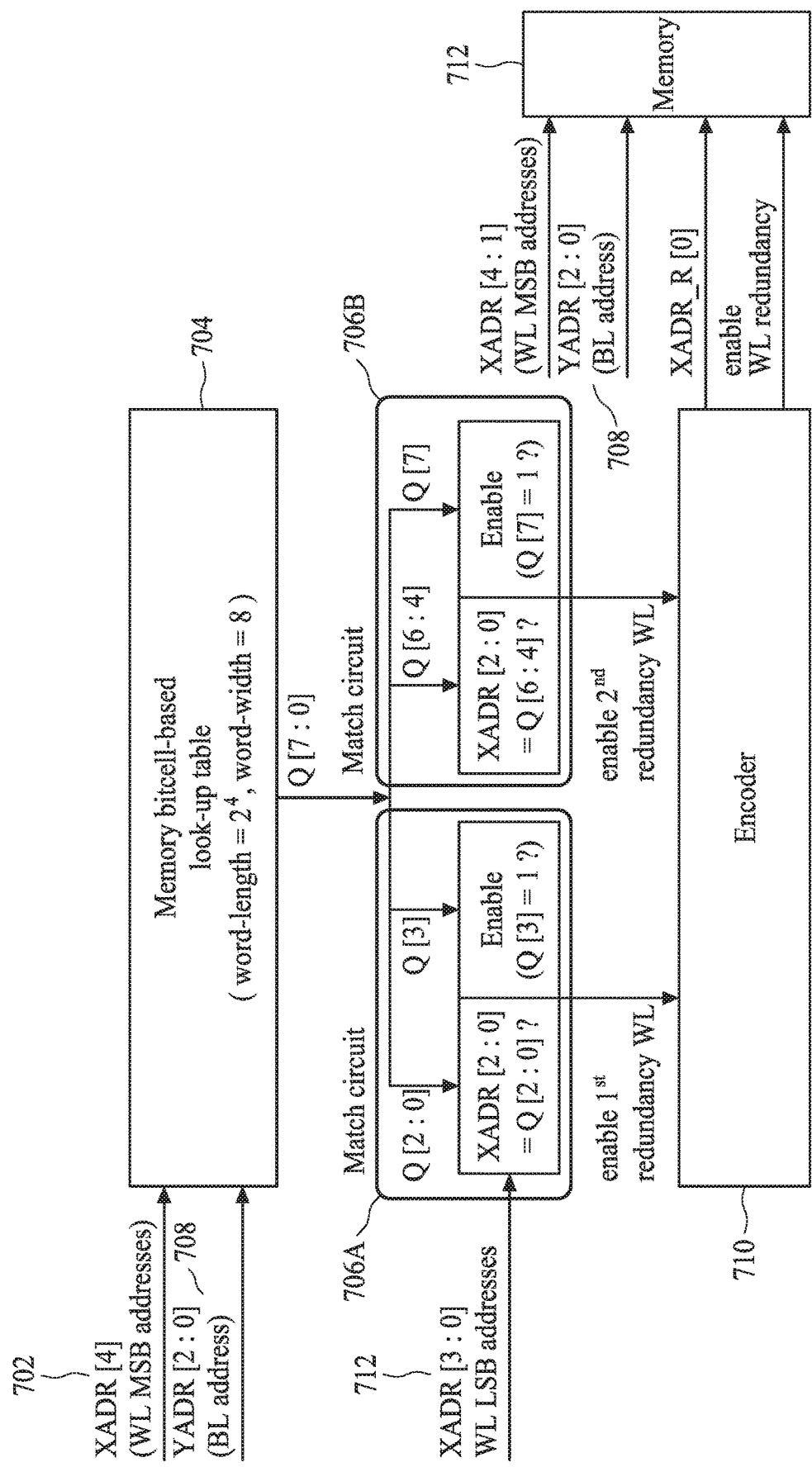
FIG. 7 is a block diagram depicting a memory device including a memory bitcell-based look-up table that enables row repair, in accordance with some embodiments.

FIG. 7 is a block diagram depicting a memory device including a memory bitcell-based look-up table 704 that enables row repair, in accordance with some embodiments. The memory device of FIG. 7 includes a memory bitcell-based look-up table 704 that is similar to the memory bitcell-based look-up table 104 of FIG. 1A described above. In the embodiment of FIG. 7, the memory bitcell-based look-up table 704 has a word length of $2^4$ bits (16 bits) and a word width of 8 bits, as shown in the figure. Other values for word length and word width are within the scope of the disclosure. A memory 712 includes a normal array and repair array similar to the normal array 108 and repair array 110, respectively, of FIGS. 1A and 2-4. In the embodiment of FIG. 7, the memory 712 includes the normal array having thirty-two (32) word-line rows WL[31:0], and the repair array having four (4) redundancy word-line rows WL[3:0]. Different numbers of word-line rows are included in the normal array and the repair array in other embodiments.

The memory device of FIG. 7 receives an input memory address that specifies a memory address of the normal array of the memory 712 for performing a memory access operation (e.g., a read operation, a write operation, etc.). In the embodiment of FIG. 7, the input memory address includes a word-line address that is a binary number having 5 bits (XADR[4:0]). In other embodiments, the input memory address is specified using more bits or fewer bits (e.g., 3 bits, 6 bits, etc.). The embodiment of FIG. 7 includes match circuits 706A, 706B configured to evaluate whether the input memory address is stored as a defective address in the memory bitcell-based look-up table 704. To implement this, the memory bitcell-based look-up table 704 is configured to receive a first portion 702 of the word-line address of the input memory address. As shown in the figure, in the embodiment of FIG. 7, the first portion 702 is the most-significant bit (XADR[4]) of the word-line address. In other embodiments, the first portion 702 includes a set of most-significant bits (e.g., XADR[4:3]) of the word-line address of the input memory address. The memory-bitcell based look-up table 704 is also configured to receive a bit-line address 708 that is a binary number having 3 bits (YADR[2:0]). The receipt of the bit-line address 708 YADR[2:0] at the memory bitcell-based look-up table 704 enables different row repair for different bit-line addresses.

The memory bitcell-based look-up table 704 matches the first portion 702 of the word-line address of the input memory address to the set of entries that it stores for the specified bit-line address 708 to generate an 8-bit, binary output Q[7:0] that is transmitted to the match circuits 706A, 706B. In other embodiments, the output Q comprises more bits or fewer bits (e.g., 6 bits, 10 bits, etc.). In embodiments, the output Q[7:0] comprises portions of defective memory addresses stored by the memory bitcell-based look-up table 704. The defective memory addresses are those having the most-significant bit XADR[4] of the word-line address specified by the first portion 702, and the output Q[7:0] includes additional, least-significant bits of the defective addresses.

Specifically, in the embodiment of FIG. 7, the match circuit 706A receives Q[3:0] and further receives a second portion 712 (XADR[3:0]) of the word-line address of the input memory address. Q[2:0] comprises least-significant bits of a first defective memory address stored by the memory bitcell-based look-up table 704, and Q[3] comprises a first enable flag. The match circuit 706A compares Q[2:0] to XADR[2:0] to evaluate whether the input memory address is stored as a defective address in the memory bitcell-based look-up table 704. If the match circuit 706A determines that Q[2:0] matches XADR[2:0], and Q[3] is equal to "1," then the match circuit 706A transmits a signal indicating that the first redundancy word-line row WL[0] or the second redundancy word-line row WL[2] of the repair array of the memory 712 should be enabled.

Likewise, the match circuit 706B receives Q[7:4] and further receives the second portion 712 (XADR[3:0]) of the word-line address of the input memory address. Q[6:4] comprises least-significant bits of a second defective memory address stored by the memory bitcell-based look-up table 704, and Q[7] comprises a second enable flag. The match circuit 706B compares Q[6:4] to XADR[2:0] to evaluate whether the input memory address is stored as a defective address in the memory bitcell-based look-up table 704. If the match circuit 706B determines that Q[6:4] matches XADR[2:0], and Q[7] is equal to "1," then the match circuit 706B transmits a signal indicating that a third redundancy word-line row WL[1] or a fourth redundancy word-line row WL[3] of the repair array of the memory 712 should be enabled.

An encoder 710 receives the redundancy row enable signals from the match circuits 706A, 706B and encodes them. Specifically, in the embodiment of FIG. 7, if the match circuit 706A indicates that the first redundancy word-line row WL[0] or the second redundancy word-line row WL[2] of the repair array should be enabled, then the encoder 710 transmits an output XADR_R[0]=0 and an enable WL redundancy signal equal to "1" to the memory 712. If the match circuit 706B indicates that the third redundancy word-line row WL[1] or the fourth redundancy word-line row WL[3] of the repair array should be enabled, then the encoder 710 transmits an output XADR_R[0]=1 and an enable WL redundancy signal equal to "1" to the memory 712. If the match circuits 706A, 706B indicate that none of the redundancy word-line rows WL[0]-[3] should be enabled, then the encoder 710 transmits an enable WL redundancy signal equal to "0" to the memory 712.

The memory 712 receives the aforementioned XADR_R[0] and enable WL redundancy signals and further receives (i) bits XADR[4:1] of the word-line address of the input memory address, and (ii) the bit-line address 708 (YADR[2:0]). The memory 712 uses the received information to access a specified word-line row of its normal array or repair array. In the embodiment of FIG. 7, the memory 712 accesses the word-line row according to the following table:

| Wordline # | XADR[4] | XADR[3:1] | XADR_R[0] | Enable WL redundancy |
|---|---|---|---|---|
| Redundancy WL[3] | 1 | Don't care | 1 | 1 |
| Redundancy WL[2] | 1 | Don't care | 0 | 1 |
| Redundancy WL[1] | 0 | Don't care | 1 | 1 |

-continued

| Wordline # | XADR[4] | XADR[3:1] | XADR_R[0] | Enable WL redundancy |
|---|---|---|---|---|
| Redundancy WL[0] | 0 | Don't care | 0 | 1 |
| WL[31:0] | 0/1 | 000~111 | 0/1 | 0 |

As seen above in this embodiment, if the most-significant bit XADR[4] of the word-line address of the input memory address is equal to 0, XADR_R[0] is equal to 0, and the enable WL redundancy signal is equal to 1, then the memory 712 accesses the first redundancy word-line row WL[0] of the repair array. If the most-significant bit XADR[4] of the word-line of the input memory address is equal to 0, XADR_R[0] is equal to 1, and the enable WL redundancy signal is equal to 1, then the memory 712 accesses the second redundancy word-line row WL[1] of the repair array. If the most-significant bit XADR[4] of the word-line of the input memory address is equal to 1, XADR_R[0] is equal to 0, and the enable WL redundancy signal is equal to 1, then the memory 712 accesses the third redundancy word-line row WL[2] of the repair array. If the most-significant bit XADR[4] of the word-line of the input memory address is equal to 1, XADR_R[0] is equal to 1, and the enable WL redundancy signal is equal to 1, then the memory 712 accesses the fourth redundancy word-line row WL[3] of the repair array. If the enable WL redundancy signal is equal to 0, then the memory 712 accesses one of the thirty-two (32) word-lines rows WL[31:0] specified by XADR[4:1].

Figure 8:
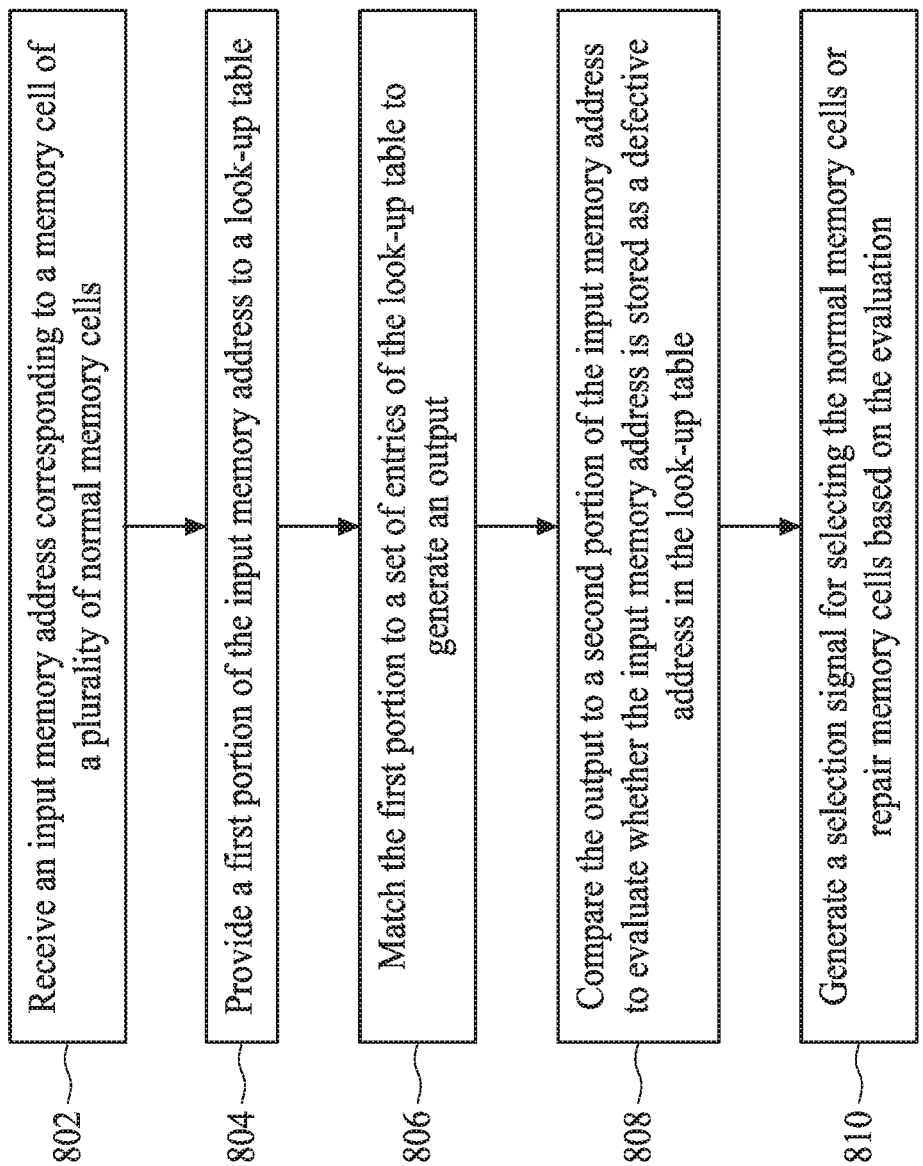
FIG. 8 is a flowchart depicting steps of an example method for repairing a memory, in accordance with some embodiments.

FIG. 8 is a flowchart depicting steps of an example method for repairing a memory, in accordance with some embodiments. FIG. 8 is described with reference to FIGS. 1A and 2 above for ease of understanding. But the process of FIG. 8 is applicable to other hardware arrangements as well. At 802, an input memory address (e.g., input memory address 102) for a memory cell of a plurality of normal memory cells (e.g., normal memory cells of normal array 108) is received. At 804, a first portion (e.g., first portion 202) of the input memory address is provided to a look-up table (e.g., memory bitcell-based look-up table 104) configured to store a set of entries including addresses of defective memory cells of the normal memory cells. At 806, the first portion is matched to the set of entries of the look-up table to generate an output (e.g., output 114). At 808, the output is compared to a second portion (e.g., second portion 204) of the input memory address to evaluate whether the input memory address is stored as a defective address in the look-up table. At 810, a selection signal (e.g., selection signal 112) for selecting the normal memory cells or repair memory cells (e.g., repair memory cells of repair array 110) is generated based on the evaluation. The repair memory cells store data for repairing the normal memory cells. In any of the methods disclosed herein, one or more of the described operations may omitted, and other operations may be added. Further, in any of the disclosed methods, the order of operations may vary from what is described herein. Thus, for instance, the operations 802, 804, 806, 808, 810 of FIG. 8 need not be performed in the order shown in the figure.

The present disclosure in various embodiments is directed to memory devices and methods of repairing a memory. An example memory device includes a first array including normal memory cells and a second array including repair memory cells. The repair memory cells are configured to be used in place of the normal memory cells. The memory device also includes a look-up table comprising memory bitcells configured to store a set of entries including addresses of defective memory cells of the normal memory cells. The memory device further includes a match circuit configured to evaluate whether an input memory address is stored as a defective address in the memory bitcells. The match circuit is also configured to generate a selection signal for selecting the normal memory cells or the repair memory cells based on the evaluation.

In another example, a memory device includes normal memory cells and repair memory cells configured to be used in place of the normal memory cells. The memory device also includes additional memory cells configured to store mappings between defective addresses of the normal memory cells and repair addresses of the repair memory cells. A match circuit is configured to (i) evaluate whether an input memory address is a defective address of the normal memory cells, and (ii) generate a selection signal for selecting the normal memory cells or the repair memory cells based on the evaluation and the mappings.

In an example method for repairing a memory, an input memory address for a memory cell of a plurality of normal memory cells is received. A first portion of the input memory address is provided to a look-up table configured to store a set of entries including addresses of defective memory cells of the normal memory cells. The first portion is matched to the set of entries of the look-up table to generate an output. The output is compared to a second portion of the input memory address to evaluate whether the input memory address is stored as a defective address in the look-up table. A selection signal for selecting the normal memory cells or repair memory cells is generated based on the evaluation, where the repair memory cells store data for repairing the normal memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
    a first array including normal memory cells;
    a second array including repair memory cells configured to be used in place of the normal memory cells; and
    a multiplexer coupled to the first array and the second array, the multiplexer configured to receive a selection signal from a match circuit, wherein the selection signal is for selecting from the normal memory cells and the repair memory cells based on an output generated by a memory bitcell-based look-up table indicating that an input memory address is stored as a defective address in the memory bitcell-based look-up table, receive normal data from the first array and repair data from the second array, and read data from or write data to one of the first array and the second array based on the received selection signal.

2. The memory device of claim 1, wherein the look-up table comprises static random-access memory (SRAM) cells.

3. The memory device of claim 1, wherein the look-up table comprises magnetic random-access memory (MRAM) cells, resistive random-access memory (RRAM) cells, electronic fuse (eFUSE) memory cells, or eFlash memory cells.

4. The memory device of claim 1, wherein a match circuit evaluates whether the input memory address is stored as a defective address in the look-up table based on an output from the look-up table.

5. The memory device of claim 4, wherein
the look-up table is configured to receive a first portion of the input memory address, match the first portion to the set of entries to generate the output, and transmit the output to a match circuit configured to receive a second portion of the input memory address, and compare the output to the second portion to evaluate whether the input memory address is stored as a defective address in the look-up table.

6. The memory device of claim 1, wherein
the look-up table stores mappings between defective addresses of the normal memory cells and replacement addresses of the repair memory cells, the look-up table being configured to transmit one or more replacement addresses to a match circuit.

7. The memory device of claim 1, wherein
a match circuit transmits the selection signal to the repair memory cells, the selection signal being configured to enable the repair memory cells when the evaluation indicates that the input memory address is stored as a defective address in the look-up table.

8. The memory device of claim 1, further comprising:
an error correction code (ECC) decoder configured to correct defective bits of the look-up table or second array.

9. The memory device of claim 1, wherein the look-up table comprises memory bitcells arranged in an array.

10. The memory device of claim 9, wherein the array is a matrix.

11. The memory device of claim 1, wherein at least two memory bitcells of the look-up table store one bit of information, with each memory bitcell of the at least two memory bitcells storing complementary states of each other.

12. A memory device comprising:
normal memory cells;
repair memory cells configured to be used in place of the normal memory cells;
memory cells configured to store mappings between defective addresses of the normal memory cells and repair addresses of the repair memory cells; and
a multiplexer coupled to the normal memory cells and the repair memory cells, the multiplexer configured to receive a selection signal from a match circuit, wherein the selection signal is for selecting from the normal memory cells and the repair memory cells based on an output generated by a memory bitcell-based look-up table indicating that an input memory address is a defective address of the normal memory cells, receive normal data from the normal memory cells and repair data from the repair memory cells, and output the normal data or the repair data based on the selection signal.

13. The memory device of claim 12, further comprising:
an error correction code (ECC) decoder configured to correct defective bits of the repair memory cells and the memory cells configured to store the mappings.

14. The memory device of claim 12, wherein
the repair memory cells and the memory cells configured to store the mappings are formed as pairs, a first pair being configured to repair one defected bit of the normal memory cells for a first number of continuous addresses, and a second pair being configured to repair one defected bit of the normal memory cells for a second number of continuous addresses that is different than the first number.

15. The memory device of claim 12, further comprising:
an array including additional repair memory cells and a look-up table configured to repair defective memory cells of the pairs.

16. A method of repairing a memory, the method comprising:
receiving an input memory address for a memory cell of a plurality of normal memory cells;
providing a first portion of the input memory address to a look-up table configured to store a set of entries including addresses of defective memory cells of the normal memory cells;
receiving normal data from the normal memory cells and repair data from the repair memory cells;
generating, by a match circuit, a selection signal, wherein the selection signal is for selecting from the normal memory cells and the repair memory cells based on an output generated by a memory bitcell-based look-up table indicating that the input memory address is stored as a defective address in the memory bitcell-based look-up table, the repair memory cells being configured to be used in place of the normal memory cells; and
outputting either the normal data or the repair data based on the selection signal.

17. The method of claim 16, wherein the look-up table comprises memory bitcells.

18. The method of claim 17, wherein the memory bitcells comprise SRAM cells.

19. The method of claim 17, wherein the memory bitcells comprise MRAM cells, RRAM cells, eFUSE memory cells, or eFlash memory cells.

20. The method of claim 16, further comprising:
writing data to one of the normal memory cells and the repair memory cells based on the selection signal.

* * * * *